(12) United States Patent
Sato et al.

(10) Patent No.: US 7,576,345 B2
(45) Date of Patent: Aug. 18, 2009

(54) SEMICONDUCTOR RELAY

(75) Inventors: Nobuhiro Sato, Tokyo (JP); Shinya Sato, legal representative, Aizuwakamatsu (JP); Tadaaki Sato, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 12/079,111

(22) Filed: Mar. 25, 2008

(65) Prior Publication Data
US 2009/0014669 A1    Jan. 15, 2009

(30) Foreign Application Priority Data
Mar. 28, 2007    (JP) .............................. 2007-083817

(51) Int. Cl.
G02B 27/00    (2006.01)
H01J 40/14    (2006.01)
(52) U.S. Cl. .................... 250/551; 250/214 R; 327/514
(58) Field of Classification Search ................. 250/551, 250/214 SW, 214 R; 327/514, 365, 387, 327/388, 392, 419
See application file for complete search history.

(56) References Cited
U.S. PATENT DOCUMENTS
7,439,532 B2 * 10/2008 Yamaguchi ................. 250/551

7,449,668 B2 * 11/2008 Schutten et al. ......... 250/214 SW

FOREIGN PATENT DOCUMENTS
JP    5-119110    5/1993
JP    9-213926    8/1997

* cited by examiner

*Primary Examiner*—Kevin Pyo
(74) *Attorney, Agent, or Firm*—Muramatsu & Associates

(57) ABSTRACT

The semiconductor relay comprises: an insulated type DC/DC power supply 10 having the input terminal and the output terminal insulated from each other; a pulse transformer 20 having the input terminal and the output terminal insulated from each other; an analog switch 30 which turns on and off the circuit in accordance with a state of an input signal; and a MOSFET circuit 40 which turns on and off a high voltage to a load 50. When a pulse signal is outputted from a pulse signal source 28, the pulse signal is outputted from the pulse transformer 20, and a state of the analog switch 30 is switched, a supply voltage is outputted from the output terminal of the analog switch 30, both the MOSFETs 42, 44 of the MOSFET circuit conduct, and a high AC voltage is applied to a load 50 from an AC power supply 52. Then, when a pulse signal is outputted from the pulse signal source 28, the pulse signal is outputted from the pulse transformer 20, the state of the analog switch 30 is switched, a ground voltage is outputted from the output terminal of the analog switch 30, both the MOSFETs 42, 44 of the MOSFET circuit are turned off, and the high AC voltage from the AC power supply 52 is not applied to the load 50.

10 Claims, 5 Drawing Sheets

SEMICONDUCTOR RELAY

BACKGROUND OF THE INVENTION

The present invention relates to a semiconductor relay, more specifically, a semiconductor relay which turn on and off high voltage at high speed.

A semiconductor relay which insulates the input and the output from each other by the optical coupling mode is known as a semiconductor relay which turns on and off high voltages by small input signals.

FIG. 5 illustrates a proposed semiconductor relay. This semiconductor relay includes a optical pulse generating circuit 100 which generates an optical pulse signal as a input signal, a light receiving circuit 110 which receives the optical pulse signal from the optical pulse generating circuit 100, a controller 120 which drives a MOSFET circuit 130 which will be described later in accordance with the received light signal of the light receiving circuit 110, and the MOSFET circuit 130 which is driven by the controller 120.

In the optical pulse generating circuit 100, one end of a resistor 102 is connected to the anode of a light emitting diode 101 and the collector of a transistor 103 is connected to the cathode of the light emitting diode 101. A DC power supply 104 is disposed between the other end of the resistor 102 and the emitter of the transistor 103. A pulse signal source 106 is connected to the base of the transistor 103 via a resistor 105.

The light receiving circuit 110 includes a plurality of photodiodes or solar cells serially connected. The light receiving circuit 110 receives and amplifies the optical pulse signal from the optical pulse generating circuit 100.

The controller 120 outputs a driving signal which drives the MOSFET circuit 130 in accordance with the optical pulse signal received and amplified by the light receiving circuit 110.

In the MOSFET circuit 130, two MOSFETs 131, 132 are inversely serially connected, and diodes 133, 134 are parallelly connected respectively to the MOSFETs 131, 132.

To the MOSFET circuit 130, a load 140 of this semiconductor relay and an AC power supply 141 to be applied to the load 140 are connected.

A driving signal is outputted from the controller 120 in accordance with a optical pulse signal generated from the optical pulse generating circuit 100, the MOSFET circuit 130 is driven by this driving signal, and a high voltage from the AC power supply 141 to the load 140 is turned on and off.

Similar circuit constitutions are disclosed in Japanese published unexamined patent application No. Hei 9-213926 and Japanese published unexamined patent application No. Hei 5-119110.

In the proposed semiconductor relay, the optical pulse signal from the optical pulse generating circuit 100 is received and amplified by the light receiving circuit 110, and the MOSFETs 131, 132 of the MOSFET circuit 130 are driven by the driving signal from the controller 120.

Consequently, the proposed semiconductor relay has a problem that large current cannot be supplied from the controller 120, and the MOSFETs 131, 132 cannot be switched at high speed.

SUMMARY OF THE INVENTION

An object of the present invention is to provide a semiconductor relay which can turn on and off high voltage at high speed.

The above-described object is achieved by a semiconductor relay comprising: a power transforming circuit having an input terminal and an output terminal insulated from each other, for outputting from the output terminal an output power corresponding to an input power inputted to the input terminal; a signal transmitting circuit having an input terminal and an output terminal insulated from each other, for outputting from the output terminal an output signal corresponding to an input signal inputted to the input terminal; a switching circuit to apply or not to apply the output power outputted from the output terminal of the power transforming circuit, based on the output signal outputted from the output terminal of the signal transmitting circuit; and a conduction turning-off circuit including a first terminal and a second terminal, for connecting or disconnecting the first terminal and the second terminal, based on whether or not the switching circuit applies the output power.

In the above-described semiconductor relay, it is possible that the switching circuit is an analog switch, and the conduction turning-off circuit includes a MOSFET having a source connected to the first terminal, a drain connected to the second terminal and a gate connected to one end of the analog switch.

In the above-described semiconductor relay, it is possible that the power transforming circuit is a DC/DC converter for transforming a DC power inputted to the input terminal and outputting the DC power from the output terminal.

In the above-described semiconductor relay, it is possible that the power transforming circuit includes a light emitting device connected to the input terminal and a light receiving device connected to the output terminal, receiving and transforming light outputted from the light emitting device with the light receiving device.

In the above-described semiconductor relay, it is possible that the signal transmitting circuit includes a transformer having a primary coil connected to the input terminal and a secondary coil connected to the output terminal.

In the above-described semiconductor relay, it is possible that the signal transmitting circuit includes a light emitting device connected to the input terminal and a light receiving device connected to the output terminal, receiving and transmitting the light outputted from the light emitting device with the light receiving device.

The semiconductor relay according to the present invention comprises: a power transforming circuit having an input terminal and an output terminal insulated from each other, for outputting from the output terminal an output power corresponding to an input power inputted to the input terminal; a signal transmitting circuit having an input terminal and an output terminal insulated from each other, for outputting from the output terminal an output signal corresponding to an input signal inputted to the input terminal; a switching circuit to apply or not to apply the output power outputted from the output terminal of the power transforming circuit, based on the output signal outputted from the output terminal of the signal transmitting circuit; and a conduction turning-off circuit including a first terminal and a second terminal, for connecting or disconnecting the first terminal and the second terminal, based on whether or not the switching circuit applies the output power, whereby the semiconductor relay can turn on and off high voltage at high speed.

DETAILED DESCRIPTION OF THE INVENTION

A First Embodiment

Figure 1:
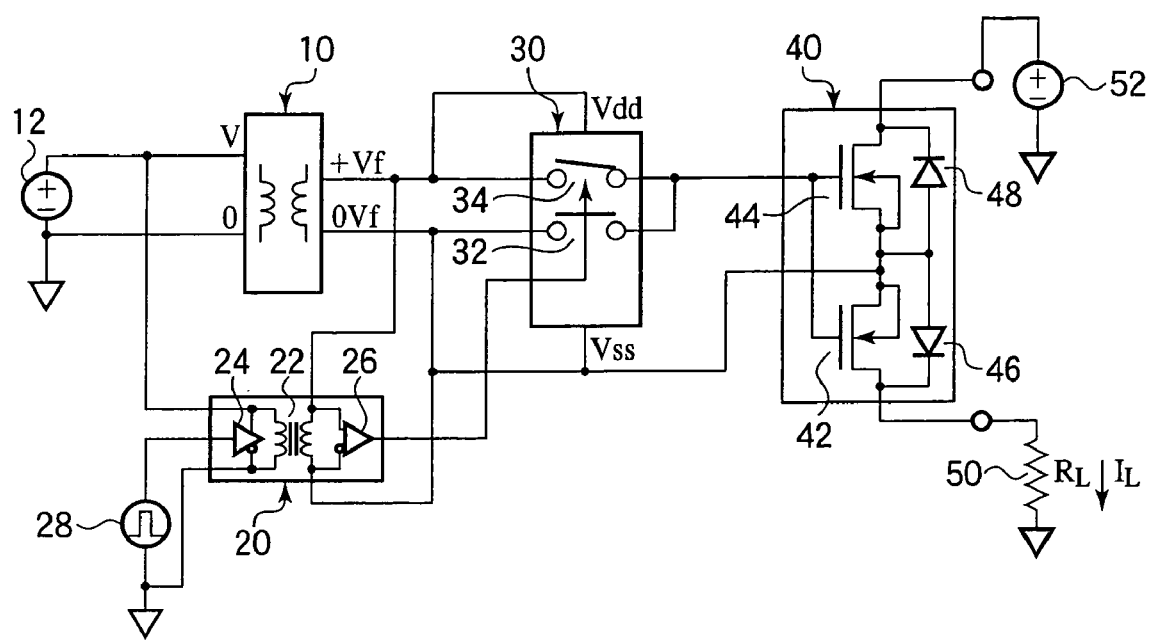
FIG. 1 is a circuit diagram of the semiconductor relay according to a first embodiment of the present invention.

The semiconductor relay according to a first embodiment of the present invention will be explained with reference to FIG. 1. FIG. 1 is a circuit diagram of the semiconductor relay according to the present embodiment.

First, the constitution of the semiconductor relay according to the present embodiment will be explained.

The semiconductor relay according to the present embodiment comprises an insulated type DC/DC power supply 10 having the input and the output insulated from each other, a pulse transformer 20 having the input and the output insulated from each other, an analog switch 30 which turns on and off the circuit in accordance with the sate of an input signal, and a MOSFET circuit 40 which turns on and off a high voltage to a load.

A DC power supply 12 of V volt (e.g., 12 V) is connected to the input side of the insulated type DC/DC power supply 10. From the output side of the insulated type DC/DC power supply 10, a DC voltage of Vf volt (e.g., 12 V) is outputted. The input side and the output side of the insulated type DC/DC power supply 10 are insulated from each other.

The pulse transformer 20 includes an isolation transformer 22, and the isolation transformer 22 has the primary side connected to an amplifier 24 and the secondary side connected to an amplifier 26.

In the pulse transformer 20, the primary side of the isolation transformer 22 is commonly connected with the input side of the insulated type DC/DC power supply 10, and the secondary side of the isolation transformer 22 is commonly connected with the output side of the insulated type DC/DC power supply 10. A pulse signal source 28 is connected to the amplifier 24 on the primary side of the pulse transformer 20.

The analog switch 30 includes two switches 32, 34. The switch 32 has one end connected to the ground terminal on the output side of the insulated type DC/DC power supply 10, and the switch 34 has one end connected to the voltage terminal on the output side of the insulated type DC/DC power supply 10. The switch 32 and the switch 34 have the other ends commonly connected with each other.

The analog switch 30 has the input terminal connected to the output terminal of the amplifier 26 on the secondary side of the isolation transformer 22 of the pulse transformer 20. When a pulse signal is inputted to the input terminal of the analog switch 30, the on/off states of the switches 32, 34 are switched. When one of the switch 32 and the switch 34 is on, the other is always off. When a pulse signal is inputted to the input terminal of the analog switch 30, the on/off states of the switch 32 and the switch 34 are changed.

The driving power supplies (Vdd, Vss) for the analog switch 30 are supplied from the output side of the insulated type DC/DC power supply 10.

The MOSFET circuit 40 includes MOSFETs 42, 44 and diodes 46, 48. The two MOSFETs 42, 44 are inversely serially connected, and the diodes 46, 48 are parallelly connected respectively to the MOSFETs 42, 44.

The gate electrodes of the MOSFETs 42, 44 of the MOSFET circuit 40 are commonly connected and connected to the other terminal of the switches 32, 34 of the analog switch 30.

To the MOSFET circuit 40, a load 50 of this semiconductor relay and an AC power supply 52 to be applied to the load 50 are connected. The AC power supply 52 outputs an AC voltage of, e.g., 30 volt, and when the semiconductor relay according to the present embodiment is on, the high AC voltage of, about 30 volt ($R_L \times I_L$ volt) is applied, and no high AC voltage is applied to the load 50 when the semiconductor relay is off.

Next, the operation of the semiconductor relay according to the present embodiment will be explained.

First, when the switch 32 is on and the switch 34 is off in the analog switch 30, a ground voltage (Vss) is outputted from the output terminal of the analog switch 30, and the ground voltage (Vss) is applied to the gate electrodes of the MOSFETs 42, 44 of the MOSFET circuit 40. When the ground voltage (Vss) is applied to the gate electrodes, both the MOSFETs 42, 44 are turned off, and the AC voltage from the AC power supply 52 is not applied to the load 50.

Then, when a pulse signal is outputted from the pulse signal source 28, the pulse signal is applied to the primary side of the isolation transformer 22 of the pulse transformer 20 and is outputted from the secondary side of the isolation transformer 22. When the pulse signal is outputted from the secondary side of the isolation transformer 22, the pulse signal is applied to the input terminal of the analog switch 30 to switch the on/off states of the switches 32, 34, and the switch 32 is turned off, the switch 34 being tuned on.

In the analog switch 30 when the switch 34 is turned on with the switch 32 being off, a supply voltage (Vdd) is outputted from the output terminal of the analog switch 30 to be applied to the gate electrodes of the MOSFETs 42, 44 of the MOSFET circuit 40. When the supply voltage (Vdd) is applied to the gate electrodes, both the MOSFETs 42, 44 conduct, and the high AC voltage from the AC power supply 52 is applied to the load 50.

Next, when a pulse signal is outputted from the pulse signal source 28, the pulse signal is applied to the primary side of the isolation transformer 22 of the pulse transformer 20 and is outputted from the secondary side of the isolation transformer 22. When the pulse signal is outputted from the secondary side of the isolation transformer 22, the pulse signal is applied to the input terminal of the analog switch 30 to switch the on/off states of the switches 32, 34, and the switch 32 is turned on, the switch 34 being turned off.

In the analog switch 30, when the switch 32 is turned on and the switch 34 is turned off, the ground voltage (Vss) is outputted from the output terminal of the analog switch 30 and is applied to the gate electrodes of the MOSFETs 42, 44 of the MOSFET circuit 40. When the ground voltage (Vss) is applied to the gate electrodes, both the MOSFETs 42, 44 are turned off, and the high AC voltage from the AC power supply 52 is not applied to the load 50.

As described above, by the pulse signal from the pulse signal source 28, the application of the high AC voltage to the load 50 can be turned on and off.

According to the present embodiment, the pulse transformer 20 which can operate at high speed is used in order to input a pulse signal, and the analog switch 30 which can operate at high speed is used in order to drive the MOSFET circuit 40, whereby the voltage application to the load 50 can be turned on and off at high speed.

The switching speed of the semiconductor relay according to the present embodiment is determined by a propagation delay time (tpd1) of the pulse transformer 20 and a propagation delay time (tpd2) of the analog switch 30. The switching time of the MOSFET circuit 40 is determined by an RC time constant which depends on an ON resistance (Ron) of the analog switch 30 and a gate capacity (C) of the MOSFETs 42, 44.

In the semiconductor relay according to the present embodiment, the propagation delay time (tpd1) of the pulse transformer 20 is, e.g., 100 nsec, the propagation delay time (tpd2) of the analog switch 30 is, e.g., 100 nsec, the ON resistance (Ron) of the analog switch 30 is, e.g., 50Ω, and the gate capacity (C) of the MOSFETs 42, 44 is, e.g., 20 nC, and thus the semiconductor relay according to the present embodiment can turn on and off the voltage application to the load 50 at a speed as high as, e.g., 1.2 μsec.

A Second Embodiment

Figure 2:
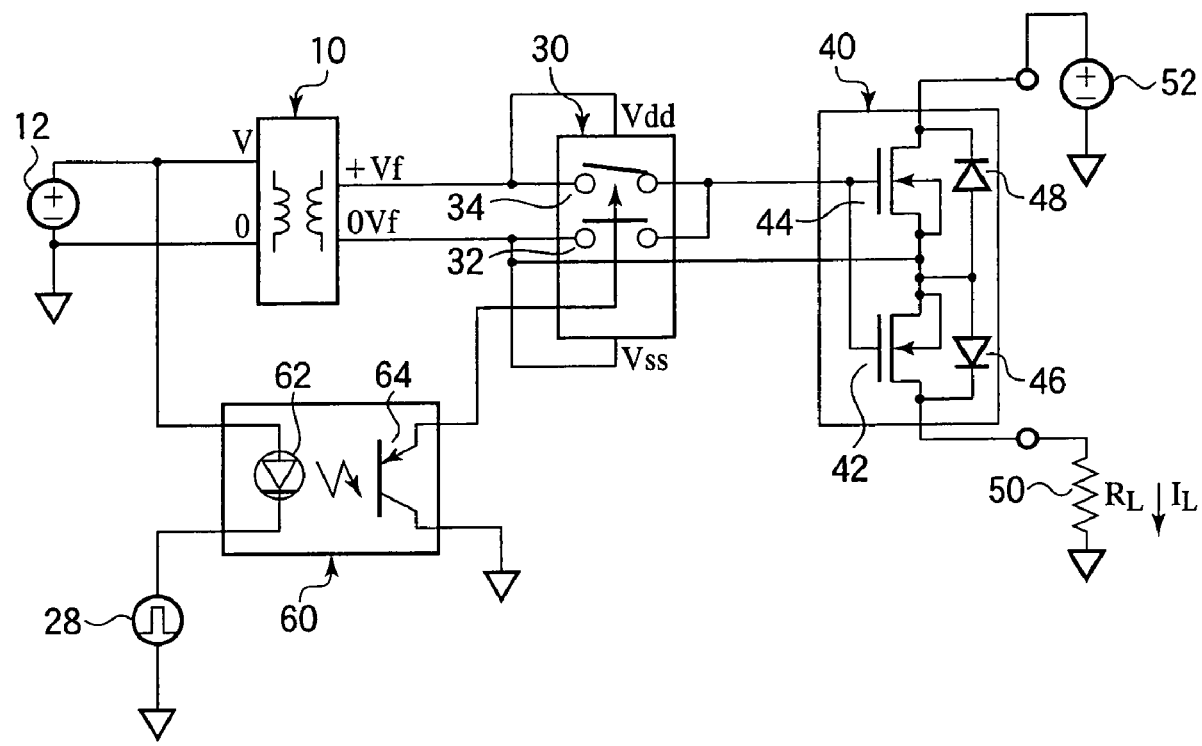
FIG. 2 is a circuit diagram of the semiconductor relay according to a second embodiment of the present invention.

The semiconductor relay according to a second embodiment of the present invention will be explained with reference to FIG. 2. FIG. 2 is a circuit diagram of the semiconductor relay according to the present embodiment. The same members or the members of the same kinds of the present embodiment as those of the semiconductor relay according to the first embodiment are represented by the same reference numbers not to repeat or to simplify their explanation.

The constitution of the semiconductor relay according to the present embodiment will be explained.

The semiconductor relay according to the present embodiment includes a photocoupler 60 in place of the pulse transformer 20 of the semiconductor relay according to the first embodiment.

The photocoupler 60 is a coupling device combining a light emitting diode 62 and a phototransistor 64 with light as a medium and is one kind of the photoisolator.

The pulse signal source 28 is connected to the light emitting diode 62. The emitter of the phototransistor 64 is connected to the input terminal of the analog switch 30.

Pulsed light is outputted from the light emitting diode 62 in accordance with a pulse signal from the pulse signal source 28. The phototransistor 64 receives the pulsed light from the light emitting diode 62 and is turned on for a short period of time to change the on/off states of the switch 32 and the switch 34 of the analog switch 30.

Next, the operation of the semiconductor relay according to the present embodiment will be explained.

First, when the switch 32 is on and the switch 34 is off in the analog switch 30, a ground voltage (Vss) is outputted from the output terminal of the analog switch 30, and the ground voltage (Vss) is applied to the gate electrodes of the MOSFETs 42, 44 of the MOSFET circuit 40. When the ground voltage (Vss) is applied to the gate electrodes, both the MOSFETs 42, 44 are turned off, and the high AC voltage from the AC power supply 52 is not applied to the load 50.

Then, when a pulse signal is outputted from the pulse signal source 28, pulsed light is outputted from the light emitting diode 62 of the photocoupler 60, and the phototransistor 64 is turned on for a short period of time. When the phototransistor 64 is turned on for a short period of time, a pulse signal is applied to the input terminal of the analog switch 30 to switch the on/off states of the switches 32, 34, and the switch 32 is turned off, the switch 34 being turned on.

In the analog switch 30, when the switch 32 is turned on, and the switch 34 is turned off, a supply voltage (Vdd) is outputted from the output terminal of the analog switch 30, and the supply voltage (Vdd) is applied to the gate electrodes of the MOSFETs 42, 44 of the MOSFET circuit 40. When the supply voltage (Vdd) is applied to the gate electrodes, both the MOSFETs 42, 44 conduct, and the high AC voltage from the AC power supply 52 is applied to the load 50.

Then, when a pulse signal is outputted from the pulse signal source 28, pulsed light is outputted from the light emitting diode 62 of the photocoupler 60, and the phototransistor 64 is turned on for a short period of time. When the phototransistor 64 is turned on for a short period of time, a pulse signal is applied to the input terminal of the analog switch 30 to switch the on/off states of the switches 32, 34, and the switch 32 is turned on, the switch 34 being switched off.

In the analog switch 30, when the switch 32 is turned on, and the switch 34 is turned off, a ground voltage (Vss) is outputted from the output terminal of the analog switch 30, and the ground voltage (Vss) is applied to the gate electrodes of the MOSFETs 42, 44 of the MOSFET circuit 40. When the ground voltage (Vss) is applied to the gate electrodes, both the MOSFETs 42, 44 are turned off, and the high AC voltage from the AC power supply 52 is not applied to the load 50.

As described above, by the pulse signal from the pulse signal source 28, the application of the high AC voltage to the load 50 can be turned on and off.

According to the present embodiment, the photocoupler 60 which can operate at high speed is used in order to input a pulse signal, and the analog switch 30 which can operate at high speed is used in order to drive the MOSFET circuit 40, whereby the voltage application to the load 50 can be turned on and off at very high speed.

The switching speed of the semiconductor relay according to the present embodiment is determined by a propagation delay time (tpd3) of the photocoupler 60 and a propagation delay time (tpd2) of the analog switch 30. The switching time of the MOSFET circuit 40 is determined by an RC time constant which depends on an ON resistance (Ron) of the analog switch 30 and a gate capacity (C) of the MOSFETs 42, 44.

In the semiconductor relay according to the present embodiment, the propagation delay time (tpd3) of the photocoupler 60 is, e.g., 400 nsec, the propagation delay time (tpd2) of the analog switch 30 is, e.g., 100 nsec, the ON resistance (Ron) of the analog switch 30 is, e.g., 50 Ω, and the gate capacity (C) of the MOSFETs 42, 44 is, e.g., 20 nC, and thus the semiconductor relay according to the present embodiment can turn on and off the voltage application to the load 50 at speed as high as, e.g. 1.5 μsec.

A Third Embodiment

Figure 3:
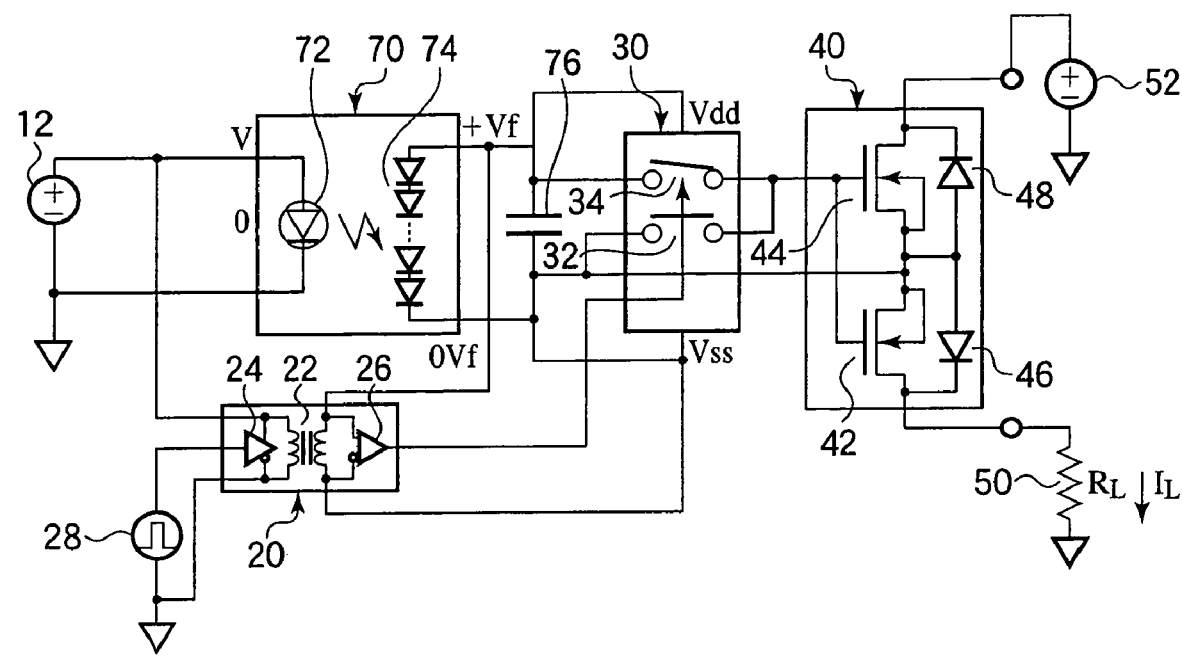
FIG. 3 is a circuit diagram of the semiconductor relay according to a third embodiment of the present invention.

The semiconductor relay according to a third embodiment of the present invention will be explained with reference to FIG. 3. FIG. 3 is a circuit diagram of the semiconductor relay according to the present embodiment. The same members or the members of the same kinds of the present embodiment as those of the first embodiment are represented by the same reference numbers not to repeat or to simplify their explanation.

First, the constitution of the semiconductor relay according to the present embodiment will be explained.

The semiconductor relay according to the present embodiment includes an optical coupling DC power supply 70 in place of the insulated type DC/DC power supply 10 of the semiconductor relay according to the first embodiment.

The optical coupling DC power supply 70 includes a light emitting diode 72 which emits light, a light receiving circuit 74 having a plurality of photodiodes or solar cells serially connected, and a condenser 76 which stores charges. The DC power supply 12 is connected to the light emitting diode 72. The light emitting diode 72 and the light receiving circuit 74 are optically coupled. The condenser 76 is connected to the light receiving circuit 74 and supplies a stable output voltage to the analog switch 30 even when the output signal from the light receiving circuit 74 are unstable.

The light emitting diode 72 keeps emitting light with the power supply from the DC power supply 12. The light receiving circuit 74 receives and amplifies the light signal from the light emitting diode 72. The condenser 76 makes it possible for the optical coupling DC power supply 70 to supply a stable output voltage to the analog switch 30.

Next, the operation of the semiconductor relay according to the present embodiment will be explained.

The present embodiment is the same as the first embodiment except that, in the present embodiment, in place of the insulated type DC/DC power supply 10, the optical coupling DC power supply 70 supplies a DC voltage as the power supply, and the operation of the present embodiment will not be repeated.

According to the present embodiment, the pulse transformer 20 which can operate at high speed is used in order to input a pulse signal, and the analog switch 30 which can operate at high speed is used in order to drive the MOSFET circuit 40, whereby as in the first embodiment, the voltage application to the load 50 can be turned on and off at high speed.

A Fourth Embodiment

Figure 4:
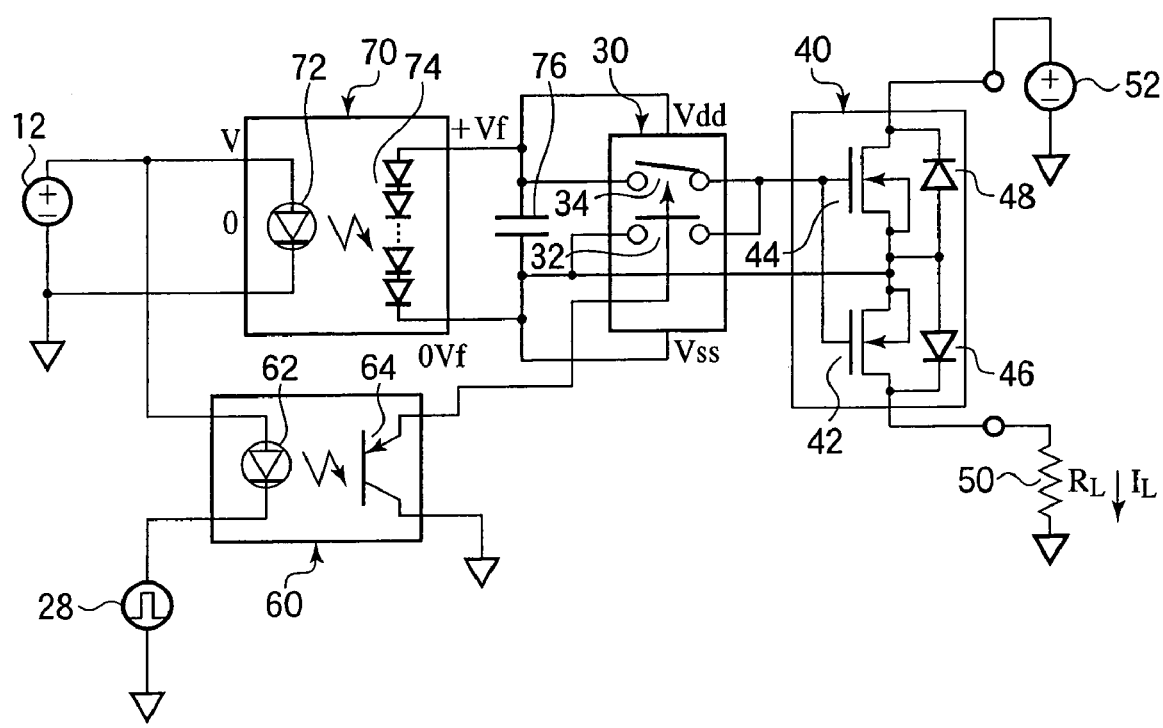
FIG. 4 is a circuit diagram of the semiconductor relay according to a fourth embodiment of the present invention.
Figure 5:
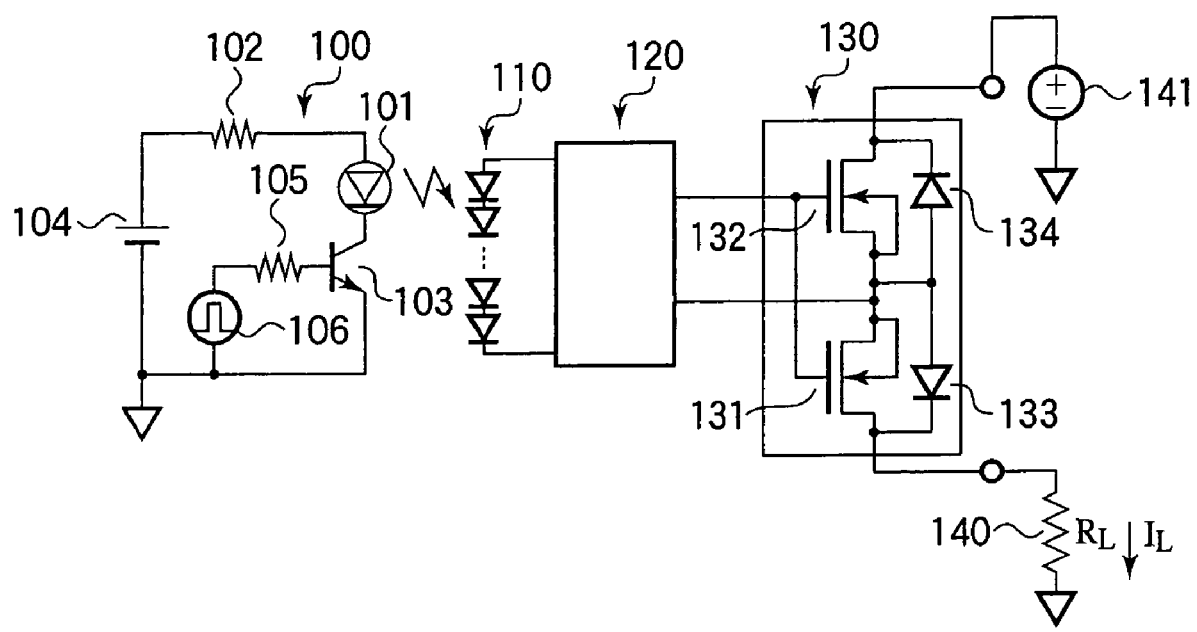
FIG. 5 is a circuit diagram of the proposed semiconductor relay.

The semiconductor relay according to a fourth embodiment of the present invention will be explained with reference to FIG. 4. FIG. 4 is a circuit diagram of the semiconductor relay according to the present embodiment. The same members or the members of the same kinds as those of the first embodiment, the second embodiment and the third embodiment are represented by the same reference numbers not to repeat or to simplify their explanation.

First, the constitution of the semiconductor relay according to the present embodiment will be explained.

The semiconductor relay according to the present embodiment includes the photocoupler 60 in place of the pulse transformer 20 of the semiconductor relay according to the first embodiment, and the optical coupling DC power supply 70 in place of the insulated type DC/DC power supply 10 of the semiconductor relay according to the first embodiment.

The photocoupler 60 is the same as that of the semiconductor relay according to the second embodiment, and the optical coupling DC power supply 70 is the same as that of the semiconductor relay according to the third embodiment. Their details will not be repeated.

Next, the operation of the semiconductor relay according to the present embodiment will be explained.

The present embodiment is the same as the second embodiment except that in the present embodiment, in place of the insulated type DC/DC power supply 10, the optical coupling DC power supply 70 supplies a DC voltage as the power supply, and explanation of the operation will not be repeated.

According to the present embodiment, the photocoupler 60 which can operate at high speed is used in order to input a pulse signal, and the analog switch 30 which can operate at high speed is used in order to drive the MOSFET circuit 40, whereby the voltage application to the load 50 can be turned on and off at very high speed.

Modified Embodiments

The present invention is not limited to the above-described embodiments and can cover other various modifications.

For example, in the above-described embodiments, as the power transforming circuit which outputs from the output terminal an output power corresponding to an input power inputted to the input terminal, the insulated type DC/DC power supply and the optical coupling DC power supply are used. However, they are not essential, and other circuit constitutions may be used.

In the above-described embodiments, as the signal transmitting circuit which outputs from the output terminal an output signal corresponding to an input signal inputted to the input terminal, the pulse transformer and the photocoupler are used. However, they are not essential, and other circuit constitutions may be used.

In the above-described embodiments, as the switching circuit which switches the application of an output power based on an output signal, the analog switch is used. However, this is not essential, and other circuit constitutions may be used.

In the above-described embodiments, as the conduction turning-off circuit which connects or disconnects the terminals, based on a switching state of the switching circuit, the MOSFET circuit is used. However, this is not essential, and other circuit constitutions may be used.

What is claimed is:

1. A semiconductor relay comprising:
    a power transforming circuit having an input terminal and an output terminal insulated from each other, for outputting from the output terminal an output power corresponding to an input power inputted to the input terminal;
    a signal transmitting circuit having an input terminal and an output terminal insulated from each other, for outputting from the output terminal an output signal corresponding to an input signal inputted to the input terminal;
    a switching circuit to apply or not to apply the output power outputted from the output terminal of the power transforming circuit, based on the output signal outputted from the output terminal of the signal transmitting circuit; and
    a conduction turning-off circuit including a first terminal and a second terminal, for connecting or disconnecting the first terminal and the second terminal, based on whether or not the switching circuit applies the output power.

2. A semiconductor relay according to claim 1, wherein the switching circuit is an analog switch, and
    the conduction turning-off circuit includes a MOSFET having a source connected to the first terminal, a drain connected to the second terminal and a gate connected to one end of the analog switch.

3. A semiconductor relay according to claim 1, wherein the power transforming circuit is a DC/DC converter for transforming a DC power inputted to the input terminal and outputting the DC power from the output terminal.

4. A semiconductor relay according to claim 2, wherein the power transforming circuit is a DC/DC converter for transforming a DC power inputted to the input terminal and outputting the DC power from the output terminal.

5. A semiconductor relay according to claim 1, wherein the power transforming circuit includes a light emitting device connected to the input terminal and a light receiving device connected to the output terminal, receiving and transforming light outputted from the light emitting device with the light receiving device.

6. A semiconductor relay according to claim 2, wherein the power transforming circuit includes a light emitting device connected to the input terminal and a light receiving device connected to the output terminal, receiving and transforming light outputted from the light emitting device with the light receiving device.

7. A semiconductor relay according to claim 1, wherein the signal transmitting circuit includes a transformer having a primary coil connected to the input terminal and a secondary coil connected to the output terminal.

8. A semiconductor relay according to claim 2, wherein the signal transmitting circuit includes a transformer having a primary coil connected to the input terminal and a secondary coil connected to the output terminal.

9. A semiconductor relay according to claim 1, wherein the signal transmitting circuit includes a light emitting device connected to the input terminal and a light receiving device connected to the output terminal, receiving and transmitting the light outputted from the light emitting device with the light receiving device.

10. A semiconductor relay according to claim 2, wherein the signal transmitting circuit includes a light emitting device connected to the input terminal and a light receiving device connected to the output terminal, receiving and transmitting the light outputted from the light emitting device with the light receiving device.

* * * * *